(12) United States Patent
Subramanian et al.

(10) Patent No.: US 6,203,927 B1
(45) Date of Patent: Mar. 20, 2001

(54) THERMAL BARRIER COATING RESISTANT TO SINTERING

(75) Inventors: Ramesh Subramanian; Stephen M. Sabol, both of Orlando, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/245,262

(22) Filed: Feb. 5, 1999

(51) Int. Cl.$^7$ .................................................. B32B 9/00
(52) U.S. Cl. ........................ 428/623; 428/633; 428/650; 428/469; 428/472; 428/472.2; 416/241 B
(58) Field of Search .................... 428/623, 632, 428/633, 650, 652, 653, 670, 678, 679, 680, 469, 472, 472.2; 416/241 B

(56) References Cited

U.S. PATENT DOCUMENTS

| | | |
|---|---|---|
| 4,321,310 | 3/1982 | Ulion et al. . |
| 4,321,311 | 3/1982 | Strangman . |
| 4,401,697 | 8/1983 | Strangman . |
| 4,405,659 | 9/1983 | Strangman . |
| 4,738,227 | 4/1988 | Kamo et al. . |
| 4,761,346 | 8/1988 | Naik . |
| 5,238,752 | 8/1993 | Duderstadt et al. . |
| 5,514,482 | 5/1996 | Strangman . |
| 5,562,998 | 10/1996 | Strangman . |
| 5,683,825 | 11/1997 | Bruce et al. . |

FOREIGN PATENT DOCUMENTS

| | | |
|---|---|---|
| 0 415 217 | 3/1991 | (EP) . |
| 0 712 940 | 5/1996 | (EP) . |
| 0 783 043 | 7/1997 | (EP) . |
| 0 937 787 | 8/1999 | (EP) . |
| 99 18259 | 4/1999 | (WO) . |

*Primary Examiner*—Timothy M. Speer
*Assistant Examiner*—Bryant Young
(74) *Attorney, Agent, or Firm*—Eckert Seamans Cherin & Mellott, LLC

(57) ABSTRACT

A device (10) having a ceramic thermal barrier coating layer (16) characterized by a microstructure having gaps (18) with a sintering inhibiting material (22) disposed on the columns (20) within the gaps (18). The sintering resistant material (22) is stable over the range of operating temperatures of the device (10) and is not soluble with the underlying ceramic layer (16). For a YSZ ceramic layer (16) the sintering resistant layer (22) may preferably be aluminum oxide or yttrium aluminum oxide, deposited as a continuous layer or as nodules.

10 Claims, 1 Drawing Sheet

US 6,203,927 B1

THERMAL BARRIER COATING RESISTANT TO SINTERING

This invention was made with U.S. Government support under contract number DE-AC05-95OR22242 awarded by the Department of Energy. The Government has certain rights in this invention.

FIELD OF THE INVENTION

This invention relates generally to the field of thermal barrier coatings, and more particularly to a thermal barrier coating for a very high temperature application such as a combustion turbine engine. In particular, this invention relates to the field of multi-layer ceramic thermal barrier coatings resistant to sintering damage for coating superalloy components of a combustion turbine.

BACKGROUND OF THE INVENTION

The demand for continued improvement in the efficiency of combustion turbine and combined cycle power plants has driven the designers of these systems to specify increasingly higher firing temperatures in the combustion portions of these systems. Although nickel and cobalt based superalloy materials are now used for components in the hot gas flow path, such as combustor transition pieces and turbine rotating and stationary blades, even these superalloy materials are not capable of surviving long term operation at temperatures sometimes exceeding 1,200 degrees C.

It is known in the art to coat a superalloy metal component with an insulating ceramic material to improve its ability to survive high operating temperatures; see for example U.S. Pat. No. 4,321,310 issued on Mar. 23, 1982, to Ulion et al. It is also known to coat the insulating ceramic material with an erosion resistant material to reduce its susceptibility to wear caused by the impact of particles carried within the hot gas flow path; see for example U.S. Pat. Nos. 5,683,825 issued on Nov. 4, 1997, to Bruce et al. and 5,562,998 issued on Oct. 8, 1996, to Strangman. Each of the above mentioned patents are incorporated by reference herein.

Much of the development in this field of technology has been driven by the aircraft engine industry, where turbine engines are required to operate at high temperatures, and are also subjected to frequent temperature transients as the power level of the engine is varied. A combustion turbine engine installed in a land-based power generating plant is also subjected to high operating temperatures and temperature transients, but it may also be required to operate at full power and at its highest temperatures for very long periods of time, such as for days or even weeks at a time. Prior art insulating systems are susceptible to degradation under such conditions at the elevated temperatures demanded in the most modern combustion turbine systems.

Accordingly, it is an object of this invention to provide a device which is capable of operating at temperatures in excess of 1,200 degrees C. for extended periods of time with reduced component degradation. It is a further object of this invention to provide a method of producing such a device that utilizes only commercially available materials processing steps.

SUMMARY

In order to achieve these and other objects of the invention, a device for operating over a range of temperatures and having a thermal barrier coating on at least a portion of its surface is provided according to this invention. The device has a substrate; a bond coat layer disposed on the substrate; a ceramic layer disposed on the bond coat layer, the ceramic layer having a microstructure characterized by a plurality of gaps extending from an outer surface of the ceramic layer toward the bond coat layer; and a sintering inhibiting material disposed within the gaps. Further, a method according to this invention for producing a device operable over a range of temperatures includes steps of: providing a substrate; disposing a bond coat layer on the substrate; disposing a ceramic layer on the bond coat layer in a manner that provides the ceramic layer with a microstructure characterized by a plurality of gaps extending from an outer surface of the ceramic layer toward the bond coat layer; and depositing within the gaps a sintering inhibiting material.

DESCRIPTION OF THE PREFERRED EMBODIMENTS

When prior art thermal barrier coating systems are exposed to the high temperature environment of the hot gas flow path of a land-based combustion turbine power plant, one of the common failure modes for the thermal barrier coating is fatigue. A current state-of-the-art thermal barrier coating is yttria-stabilized zirconia (YSZ) deposited by electron beam physical vapor deposition (EB-PVD). The EB-PVD process provides the YSZ coating with a columnar microstructure having sub-micron sized gaps between adjacent columns of YSZ material. Alternatively, the YSZ may be applied by air plasma spraying (APS), which will not provide a columnar microstructure, but will create a series of sub-micron sized cracks within the YSZ layer. For the purposes of this application, the terms "gap" is meant to include not only the gaps between adjacent columns in a columnar microstructure, but also the cracks in a layer of insulating material deposited by APS or similar processes. The gaps provide a mechanical flexibility to the insulating ceramic layer. During operation at high temperatures, it is known that these gaps have a tendency to close, and if the device is maintained at the elevated temperature for a sufficient length of time, the adjacent sides of the gaps will bond together by sintering. The bonding of the ceramic material across the gaps reduces the strain compliance of the ceramic coating, thereby contributing to failure of the coating during subsequent thermal transients.

Figure 1:
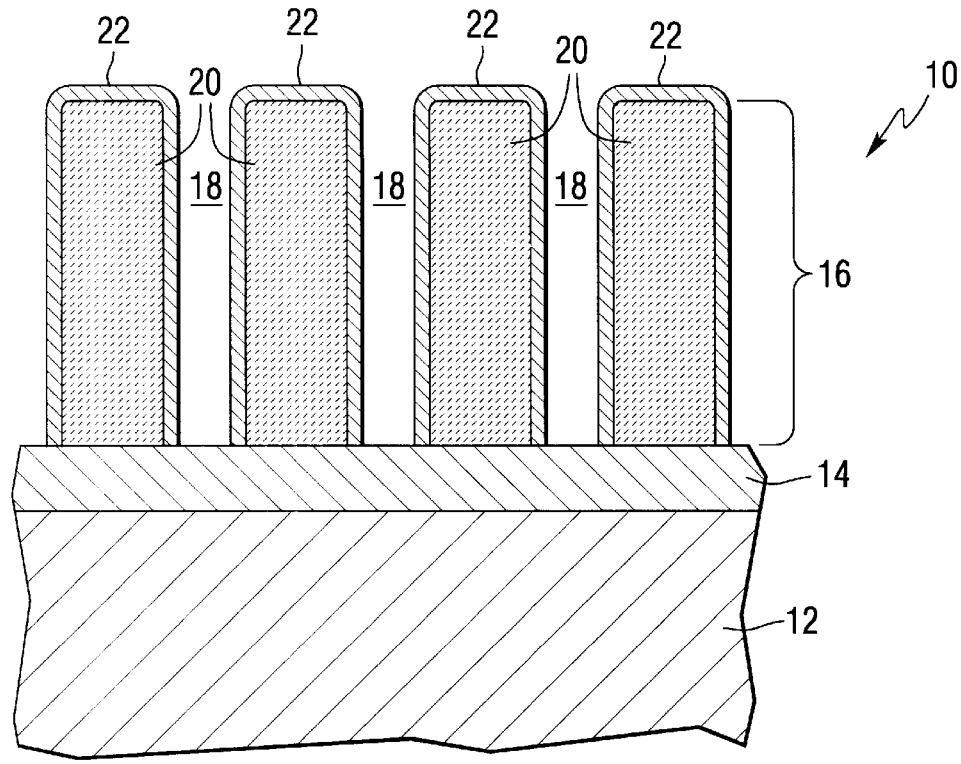
FIG. 1 is a cross-sectional view of a device having a thermal barrier coating in accordance with this invention, where a stable ceramic material is applied as a continuous coating.

FIG. 1 illustrates a cross-sectional view of a portion of a device having a thermal barrier coating which is less susceptible to a reduction of strain compliance due to sintering. The device 10 may be a combustion turbine blade or stationary vane or other part that is subjected to a hostile, high temperature environment. The device 10 has a substrate 12 that may be made of a superalloy metal or other material having the desired mechanical and chemical properties. Disposed on the substrate 12 is a bond coat layer 14. In some applications the bond coat layer 14 may be omitted or may be integral with the substrate 12. In combustion turbine applications the bond coat layer 14 may typically be an MCrAlY layer deposited by an EB-PVD, sputtering or low pressure plasma spray process. As is known in the art, the M in this formulation may represent iron, nickel or cobalt, or a mixture thereof. Alternatively, the bond coat layer 14 may be platinum or platinum aluminide, or there may be no distinct bond coat layer. Disposed on the bond coat layer, or directly on the substrate 12 in the absence of a bond coat layer 14, is a ceramic layer 16 which serves to thermally insulate the substrate 12 from the hostile environment in which it operates. The ceramic layer 16 is preferably formed of a YSZ material, for example 8 weight % yttria stabilized zirconia as is known in the art, deposited by EB-PVD to form a columnar microstructure characterized by a plurality of gaps 18 between adjacent columns 20 of YSZ material.

The device of FIG. 1 also includes a sintering inhibiting material 22 disposed within the gaps 18, but not bridging across the gaps from one column to the adjacent column. By sintering resistant material in this application it is meant any material which is more resistive to sintering than is the substrate material 12. The sintering inhibiting material 22 may be a ceramic material that is stable over the range of temperature in which the device 10 is operated, for example ambient air temperature to over 1,200 degrees C. By stable in this application it is meant that the material does not undergo a crystallographic phase transformation when exposed to the full range of its design operating temperatures.

U.S. Pat. No. 5,562,998 discussed above teaches the application of a bond inhibitor coating over a ceramic thermal barrier coating. The bond inhibitor described in that patent is an unstabilized material, such as unstabilized zirconia or unstabilized hafnia. These materials will sinter or bond together during high temperature operation, but upon cooling to lower or ambient temperatures, these materials will cycle through a disruptive tetragonal to monoclinic phase transformation. This transformation tends to break the bonds between adjacent columns. While such materials may be effective for aircraft engines that have short thermal cycles, they may be unsuitable for land based power generating engines which have longer operating cycles. During long term exposure to high temperatures, unstabilized zirconia and hafnia will dissolve into the underlying YSZ material. Once dissolved into the ceramic insulating material, the bond inhibitor material of the 5,562,998 patent is no longer available to undergo a crystallographic transformation within the gaps upon cooling. Thus, after extended periods of high temperature operation, the sintered bonds are not broken, consequently reducing the strain compliance of the ceramic insulating material and leading to premature failure of the component.

Furthermore, prior art U.S. Pat. No. 5,683,825 discussed above discloses an erosion resistant thermal barrier coating. In that patent, an erosion resistant composition such as alumina or silicon carbide is disposed on top of a ceramic insulating layer. That patent describes a relatively thick coating of erosion resistant material that does not penetrate between the columns of the underlying ceramic insulating material, and therefore does not act to prevent sintering between the columns.

The sintering inhibiting material 22 of the present invention overcomes these deficiencies in the prior art. By infiltrating a sintering inhibiting material 22 into the gaps 18 and preventing the bonding of adjacent columns 20, there is no need to rely upon a crystallographic transformation to break the bonds as in the prior art. Sintering inhibiting material 22 is preferably an oxide compound which is insoluble with the underlying ceramic layer 16, and which is stable over the range of temperatures of operation of device 10. One such sintering inhibiting material 22 for use with a ceramic layer 16 of YSZ is aluminum oxide (alumina) $Al_2O_3$. An alternative embodiment for the sintering inhibiting material 22 is yttrium aluminum oxide. The sintering inhibiting material 22 may be infiltrated into the gaps 18 via a metal organic chemical vapor deposition (CVD) process. The CVD process is used to deposit the sintering resistant material 22 to a thickness on the top surface of the columns 20 of ceramic layer 16 ranging from no more than a few angstroms to several microns. In one embodiment an alumina layer having a thickness of approximately 5 microns on the top surface of the columns 20 of the ceramic layer 16 may be used. Alternative embodiments may have a thickness of sintering resistant material on the top surface of the columns 20 of ceramic layer 16 of no more than 0.1 micron, or alternatively no more than one micron, or alternatively no more than 10 microns. The thickness of the coating of sintering resistant material 22 within the gaps 18 will be less than but generally proportional to the thickness on the surface of the ceramic layer 16. The thickness should be controlled to prevent the sintering resistant material 22 from bridging across the gaps 18, thereby degrading the performance of the coating. Because the selected sintering inhibiting material 22 does not readily sinter, the columns 20 of device 10 will not bond at high temperatures. And because the sintering inhibiting material 22 is not soluble with the underlying material of ceramic layer 16, it is maintained at the surface of the columns 20 throughout the life of the device 10, thus maintaining its resistance to sintering.

The sintering inhibiting material 22 may be applied to the insulating ceramic layer 16 as an intermediate amorphous or unstable phase. In one embodiment of the invention, amorphous alumina is deposited within the gaps 18 by a metal organic CVD process. Upon heating, either during the manufacturing process or during the initial operation of the device 10, the amorphous coating undergoes a transformation to a crystallographically stable phase, such as alpha $Al_2O_3$. It is this alpha phase that is stable at high temperatures and that performs the function of a sintering inhibitor.

The method for producing a device according to this invention utilizes processes that are commercially available. To produce such a device, a substrate 12 may first be coated with a bond coat 14 by a known process such as a low pressure plasma spray, high velocity oxygen fuel, shrouded plasma spray or air plasma spray process. The ceramic layer 16 is then disposed on the bond coat 14 by a known process such as EB-PVD, thereby providing a ceramic layer 16 having a plurality of gaps 18 therewithin. Alternatively, the ceramic layer 16 may be deposited directly onto the substrate 12 in some applications. The sintering inhibiting material 22 is then applied to the surface of the columns 20 by a vapor deposition technique such as chemical vapor deposition or metal organic CVD, or by one of a number of known infiltration techniques such as sol-gel infiltration.

Figure 2:
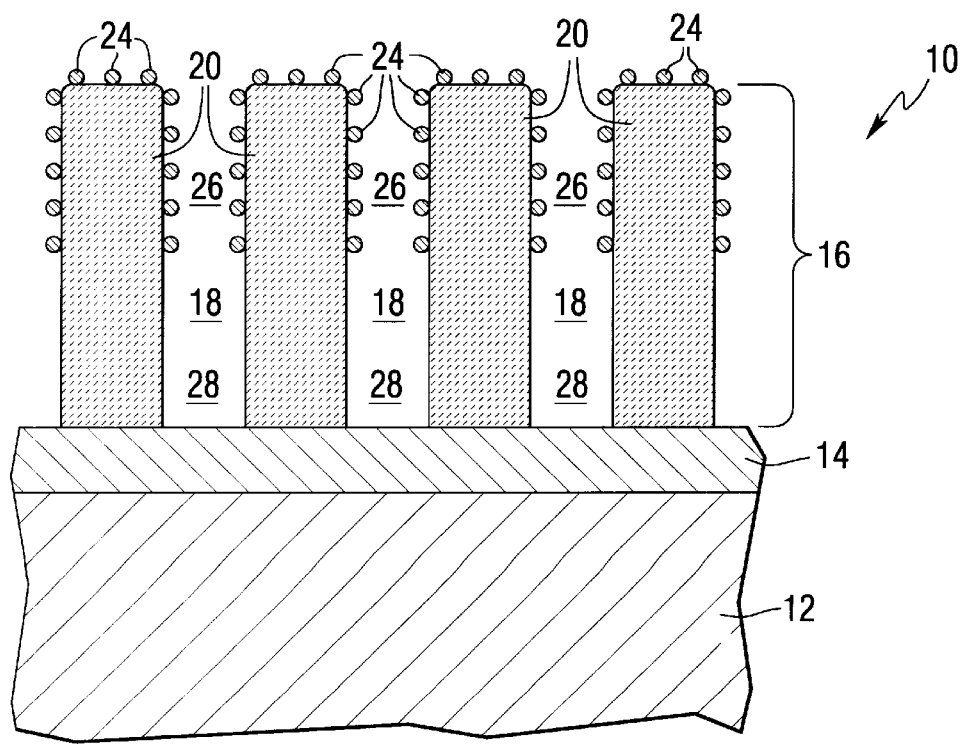
FIG. 2 is a cross-sectional view of a device having a thermal barrier coating in accordance with this invention, where a stable ceramic material is applied as a plurality of nodules.

The morphology of the sintering inhibiting material 22 may also be controlled. As illustrated in FIG. 1, sintering inhibiting material 22 may be applied as a continuous coating within the gaps 18, either as an amorphous or a stable phase. FIG. 2 illustrates an alternative embodiment of a device in accordance with this invention. Like structures are numbered consistently between the two Figures. As seen in FIG. 2, a substrate 12 having a bond coat 14 disposed thereon is coated with a ceramic layer 16 having columns 20 and gaps 18. In this embodiment, a sintering inhibiting material is disposed within the gaps 18 as a plurality of nodules 24. Nodules 24 may demonstrate a reduced tendency to form bridges between columns 20 due to a lesser contact area between nodules 24 on adjacent columns 18 when compared to a continuous coating of sintering inhibiting material 22. Furthermore, any formation of intermittent bridges between columns 18 is likely to break easily upon regular thermal cycling of device 10. The nodular morphology is achieved by controlling the thickness of the applied coating of material and the subsequent heat treatment. For example, a relatively thin coating of approximately 0.1 micrometer of alumina at the top surface of the ceramic layer 16 will result in a relatively thin continuous layer in the gaps 18. During the subsequent heat treatment, as the alumina converts to the stable alpha phase it undergoes a volume reduction which tends to create nodules 24 of sintering resistant material 22 within the gaps 18. A thicker coating of approximately 1 micrometer of alumina at the surface will provide a thick enough coating within the gaps 18 that even after heat treatment the sintering resistant material 22 will remain as a continuous coating. An alternative method of achieving a continuous coating within the gaps 18 is to apply multiple thin layers of the sintering resistant material 24 so that the space between the nodules 24 is essentially filled with other nodules 24 to create a continuous coating 22.

Furthermore, in the embodiment of FIG. 2, the sintering inhibiting material is disposed within only a top portion 26 of gaps 18 and not a bottom portion 28 of gaps 18. The geometry of the gaps 18 and the process for depositing the coating will control this variable.

Other aspects, objects and advantages of this invention may be obtained by studying the Figures, the disclosure, and the appended claims.

We claim as our invention:

1. A device operating over a range of temperatures and having a thermal barrier coating on at least a portion of its surface, the device comprising:

a substrate;

a ceramic layer disposed on said substrate, said ceramic layer having a microstructure wherein a plurality of gaps extend from an outer surface of said ceramic layer toward said substrate; and a sintering inhibiting material comprising a material selected from the group consisting of aluminum oxide and yttrium aluminum oxide disposed within said gaps.

2. The device of claim 1, wherein said sintering inhibiting material comprises a ceramic material stable over said range of temperatures.

3. The device of claim 1, wherein said sintering inhibiting material comprises an oxide compound that is insoluble with said ceramic layer.

4. The device of claim 1, wherein said sintering inhibiting material is disposed as a continuous coating within said gaps.

5. A device operating over a range of temperatures and having a thermal barrier coating on at least a portion of its surface, the device comprising:

a substrate;

a ceramic layer disposed on said substrate, said ceramic layer having a microstructure wherein a plurality of gaps extend from an outer surface of said ceramic layer toward said substrate; and a sintering inhibiting material is disposed as a plurality of nodules within said gaps.

6. The device of claim 1, wherein said ceramic layer comprises a columnar grain microstructure, and wherein said sintering inhibiting material is disposed on the surface of the columns of said ceramic layer and is operable to prevent the bonding of adjacent columns during the operation of said device.

7. The device of claim 1, wherein said sintering inhibiting material is disposed within a top portion of said gaps but not within a bottom portion of said gaps.

8. The device of claim 1, wherein said sintering inhibiting material has a thickness on the top surface of said ceramic layer of no more than 0.1 micron.

9. The device of claim 1, wherein said sintering inhibiting material has a thickness on the top surface of said ceramic layer of no more than one micron.

10. The device of claim 1, wherein said sintering inhibiting material has a thickness on the top surface of said ceramic layer of no more than 10 microns.

\* \* \* \* \*